US009305914B2

(12) United States Patent
Unterleitner

(10) Patent No.: US 9,305,914 B2
(45) Date of Patent: Apr. 5, 2016

(54) HIGH-VOLTAGE TRANSISTOR, ESD-PROTECTION CIRCUIT, AND USE OF A HIGH-VOLTAGE TRANSISTOR IN AN ESD-PROTECTION CIRCUIT

(75) Inventor: Franz Unterleitner, Kalsdorf (AT)

(73) Assignee: ams AG, Unterpremstaetten (AT)

(*) Notice: Subject to any disclaimer, the term of this patent is extended or adjusted under 35 U.S.C. 154(b) by 415 days.

(21) Appl. No.: 13/509,790

(22) PCT Filed: Nov. 11, 2010

(86) PCT No.: PCT/EP2010/067315
§ 371 (c)(1),
(2), (4) Date: Oct. 23, 2012

(87) PCT Pub. No.: WO2011/058114
PCT Pub. Date: May 19, 2011

(65) Prior Publication Data
US 2013/0222953 A1   Aug. 29, 2013

(51) Int. Cl.
*H01L 27/02* (2006.01)
*H02H 9/04* (2006.01)
*H01L 29/06* (2006.01)
*H01L 29/10* (2006.01)
*H01L 29/78* (2006.01)
H01L 29/40 (2006.01)
H01L 29/423 (2006.01)

(52) U.S. Cl.
CPC ........ *H01L 27/0266* (2013.01); *H01L 29/0688* (2013.01); *H01L 29/1095* (2013.01); *H01L 29/7816* (2013.01); *H01L 29/7835* (2013.01); *H02H 9/044* (2013.01); *H01L 29/402* (2013.01); *H01L 29/42368* (2013.01)

(58) Field of Classification Search
CPC ............ H01L 27/0266; H01L 29/0688; H01L 29/1095; H01L 29/7816; H01L 29/7835; H01L 29/42368; H01L 29/402; H02H 9/044
USPC .......................................................... 361/56
See application file for complete search history.

(56) References Cited

U.S. PATENT DOCUMENTS

| 6,144,070 | A | 11/2000 | Devore et al. |
| 6,222,236 | B1 | 4/2001 | Lamey |
| 2003/0076639 | A1 | 4/2003 | Chen |
| 2004/0150041 | A1 | 8/2004 | Watanabe et al. |
| 2008/0225451 | A1* | 9/2008 | Ansel et al. ..................... 361/56 |

FOREIGN PATENT DOCUMENTS

| DE | 102004009521 | 9/2005 |
| EP | 1 187 214 | 3/2002 |

* cited by examiner

*Primary Examiner* — Thienvu Tran
*Assistant Examiner* — Kevin J Comber
(74) *Attorney, Agent, or Firm* — McDermott Will & Emery LLP

(57) ABSTRACT

In the high-voltage transistor, which is suitable for an ESD-protection circuit, there is no doped well or at most a portion of a second well (3) of a second conductivity type opposite a first conductivity type under a contact region (4) for the drain between a first well (2) and a semiconductor material of the substrate (1), said semiconductor material being undoped or being doped for the first conductivity type. Said portion has a lower thickness than a thickness which would provide a good insulation of the first well from the substrate and which would provide a high-breakdown voltage.

3 Claims, 1 Drawing Sheet

HIGH-VOLTAGE TRANSISTOR, ESD-PROTECTION CIRCUIT, AND USE OF A HIGH-VOLTAGE TRANSISTOR IN AN ESD-PROTECTION CIRCUIT

RELATED APPLICATIONS

This application is a U.S. National Phase Application under 35 USC 371 of International Application PCT/EP2010/067315 filed Nov. 11, 2010.

This application claims the priority of German application no. 10 2009 053 065.7 filed Nov. 13, 2009, the entire content of which hereby incorporated by reference.

FIELD OF THE INVENTION

The invention relates to a component for use in a protection circuit against ESD (electrostatic damage), with which overvoltages that occur are short-circuited to a reference potential.

BACKGROUND OF THE INVENTION

An ESD protection circuit usually comprises a trigger component and a suitably dimensioned transistor that is used as a short-circuit switch. If an overvoltage occurs on a line to be protected, the trigger turns the transistor on and the overvoltage is short-circuited to a reference potential via the transistor. The attached FIG. 3 shows a schematic of a conventional ESD protection circuit that comprises a trigger component 8 and a protection transistor 9. The trigger component 8 and the source and drain of the protection transistor 9 are connected between a line that is at reference potential and a line to be protected. The reference potential is a supply voltage Vss of an integrated circuit, in particular, ground. If an overvoltage occurs and the difference between the potential V on the line to be protected and the reference potential exceeds a predetermined value, the trigger component 8 changes the voltage present at the gate of the protection transistor 9 in such a manner that the protection transistor 9 is switched to conduct between source and drain and the overvoltage is short-circuited. The protection transistor 9 is dimensioned to be sufficiently large.

SUMMARY OF THE INVENTION

It is an object of the invention to provide an ESD protection circuit that can be made in a particularly practical manner using a conventional semiconductor process.

The high-voltage transistor, which is particularly suitable for an ESD protection circuit, allows a high saturation current because the doped well provided for the drain terminal is not insulated at all from the substrate or is insulated only very weakly. On the upper side of a substrate made of semiconductor material, the high-voltage transistor has a first well of a first conductivity type provided for a drift section and a second well of a second conductivity type, opposite to the first conductivity type, provided for a channel region. The substrate is otherwise not doped or is doped for the first conductivity type. A first contact area for a drain terminal is present in the first well and a second contact area for a source terminal is present in the second well. The contact areas are preferably doped sufficiently highly to allow a low-impedance connection. A gate dielectric is present on a region of the second well between the first contact area and the second contact area, and a gate electrode is situated on the gate dielectric.

The second well is omitted underneath the first contact area or is at least formed with a lower depth than that under the second contact area. The depth is to be measured from the upper side of the substrate into the substrate. Under the first contact area between the first well and the semiconductor material of the substrate, not doped or doped for the first conductivity type, there is therefore no doped well or, at most, a portion of the second well that has a lower thickness than would be provided for a good electrical insulation of the first well from the substrate, and a high breakdown voltage.

In another embodiment of the high-voltage transistor, the second well is arranged at the side of the first well and omitted underneath the first well.

In another embodiment, the first well is arranged within the second well and the second well has a greater depth underneath the second contact area than underneath the first contact area.

In another embodiment, the first conductivity type is p-conduction and the second conductivity type is n-conduction and the high-voltage transistor is an HV-PFET.

The ESD protection circuit comprises a trigger component and a protection transistor having the characteristics of the specified high-voltage transistor.

In another embodiment of the ESD protection circuit, a protection transistor corresponding to one of the additional embodiments of the specified high-voltage transistor is used.

Another aspect of the invention is the usage of a high-voltage transistor in an ESD protection circuit as a component that short-circuits an overvoltage to a reference potential. For this purpose, the high-voltage transistor possesses a substrate of semiconductor material and a drain, as well as an electrically conductive connection between the drain and the substrate.

Instead of this, a high-voltage transistor that comprises a first contact area and a second contact area can be used in the ESD protection circuit as a component that short-circuits an overvoltage to a reference potential. The first contact area is provided for a drain terminal in a first doped well of a first conductivity type, and the second contact area is provided for a source terminal. The first doped well is arranged in a second doped well of a second conductivity type opposite to the first conductivity type. The depth of the second doped well is less underneath the first contact area than under the second contact area. Here as well, the depth should be measured from the upper side of the substrate into the substrate.

DETAILED DESCRIPTION OF THE DRAWINGS

Figure 1:
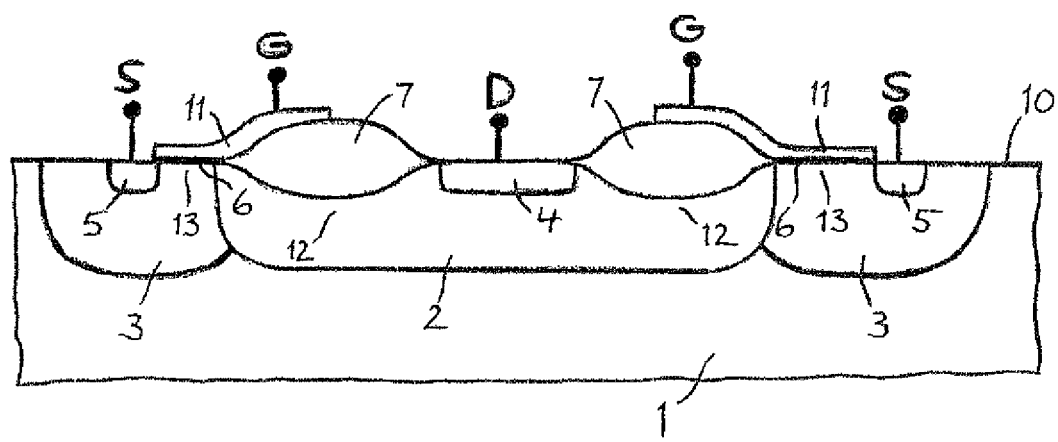
FIG. 1 shows a cross section of an embodiment of the high-voltage transistor.

FIG. 1 shows a cross-section through a high-voltage transistor for achieving a high-saturation current. A substrate 1 made of semiconductor material is not doped or is doped, preferably weakly, for a first conductivity type. A first well 2 and a second well 3 are formed on an upper side 10 of the substrate 1. The first well 2 is doped for the first conductivity type and the second well 3 is doped for the opposite conductivity type. The conductivity type of the first well 2 can be p-conduction and the conductivity type of the second well 3 is then n-conduction. For a drain terminal D, a first contact area 4 that is highly doped for the first conductivity type is arranged in the first well 2. For a source terminal S, a second contact area 5, likewise highly doped for the first conductivity type, is arranged in the second well 3. Between the first contact area 4 and the second contact area 5 there is a channel region 13 in the second well 3, on which channel region a gate dielectric 6 is present that electrically insulates a gate electrode 11 applied to its upper side from the semiconductor material of the second well 3. The gate electrode 11 is provided for a gate terminal for controlling the channel of the high-voltage transistor. A region is provided in the first well 2 as a drift section 12. In particular, a field oxide or a shallow trench isolation 7 can be arranged above the drift section 12.

The structure of the high-voltage transistor according to FIG. 1 can be symmetrical with respect to the drain terminal D. The second contact area 5 at least partially surrounds the region occupied by the first well 2. The areas of the second well 3 and the second contact area 5 as shown in the cross section of FIG. 1 are therefore separated from one another only in the cross section, but actually belong to contiguous regions of the component. This applies analogously to the gate electrode 11, which surrounds the drain terminal D and divides into two surface sections only in the cross section of FIG. 1.

Because the second well 3 is present only on the side of the first well 2 and thus is omitted underneath the first well 2, there is a direct contact between the first well 2 and the semiconductor material of substrate 1, which is not doped or is doped for the first conductivity type. The second well 3 therefore does not completely surround the drain of the high-voltage transistor. The second well 3 is dimensioned in such a manner that it forms a sufficiently large body area in which a channel can be formed between the source and drain. Since the drain diffusion, which is formed by the first well 2 and the first contact area 4 formed therein, is not surrounded by a well of the opposite conductivity type, the drain terminal is short-circuited to the substrate 1. This is desired in a component provided for an ESD protection circuit, in contrast to conventional high-voltage transistors.

If the second well 3 is also present underneath the first well 2 and is dimensioned as in conventional high-voltage transistors, the second well 3 has a significant influence on the spatial progression of the electric potential when the high-voltage transistor is in operation, and ensures a high breakdown voltage with respect to the substrate. This constricts the range that is crucial for the current-carrying capacity, and increases the on-state resistance. If, however, the second well 3 is missing underneath the first well 2, the current constriction is eliminated; a low on-state resistance results and consequently a higher saturation current. This also makes it possible to keep the space occupied by the high-voltage transistor small, which yields an additional advantage of the ESD protection circuit.

It is not necessary to completely omit the second well 3 underneath the first well 2 in order to reduce the current constriction. It can be sufficient to form the second well 3 with such a reduced thickness, due to a reduction of the dopant concentration underneath the first contact area 4, that a sufficient dissipation of the electric current to the substrate 1 is possible.

Figure 2:
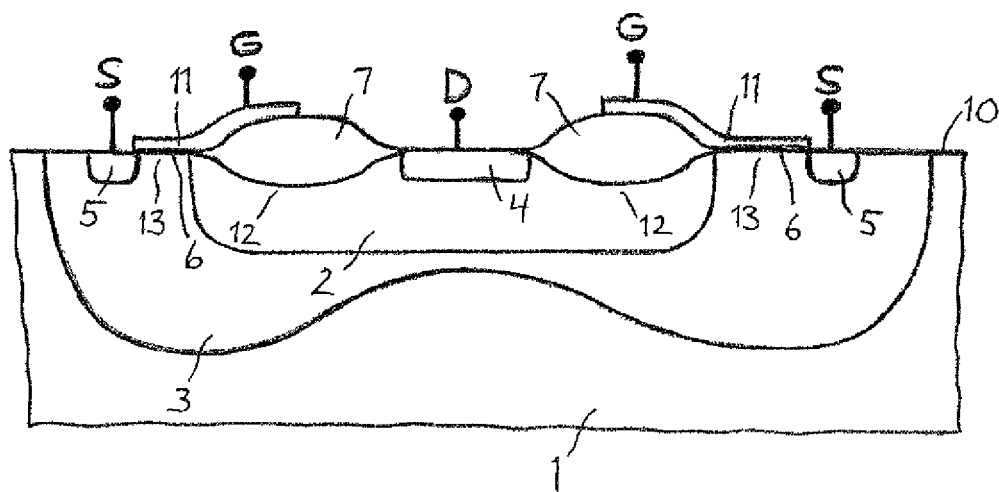
FIG. 2 shows a cross section of a further embodiment.
Figure 3:
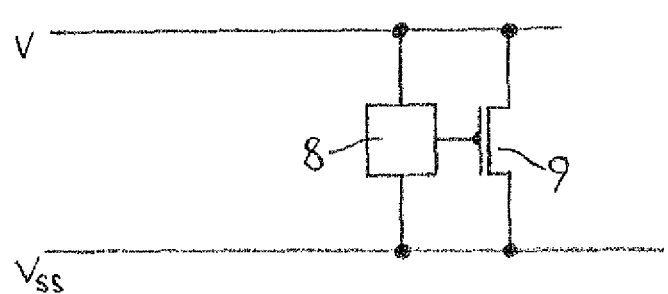
FIG. 3 shows the schematic of the conventional ESD protection circuit explained above.

FIG. 2 shows a further embodiment in which the second well 3 is not omitted underneath the first well 2, but is present underneath the first contact area 4, although only to a lesser depth. By appropriately adjusting the dopant profile, the second well 3 is formed in such a manner that its depth measured from the upper side 10 of the substrate 1 is less underneath the first contact area 4 than underneath the second contact area 5. Between the first well 2 and the semiconductor material of the substrate 1, not doped or doped for the first conductivity type, there is therefore only a small portion of the oppositely doped second well 3. This has the effect that the second well 3 underneath the drain terminal D has only a sufficiently small influence on the saturation current. In this embodiment the drain terminal is therefore not short-circuited to the substrate, but is still slightly insulated electrically. This configuration allows a further optimization of the high-voltage transistor for application in an ESD protection circuit or in comparable applications.

The second well 3 can be produced in the manufacturing process by the well implantations that are provided for other circuit components, especially other high-voltage transistors. In particular, the second well 3 can be produced by doping a shallow n-type well or a deep n-type well, or also by a combination of the two implantations. The implantation can optionally be limited by a suitably designed mask to a plurality of strip-shaped regions in order to achieve a suitable dopant profile with locally reduced dopant concentrations.

The embodiment of FIG. 2 can be produced, for example, by omitting a central region above the position intended for the drain terminal D during the implantation of the second well 3 and performing the implantation in such a manner that the implanted dopant moves under the central area below the first contact area 4 as a result of the diffusion of the dopant atoms. In this manner the thin, but still continuously present second well 3 is formed underneath the first well 2. The described embodiments can therefore be produced with the usual implantation steps.

The high-voltage transistor is optimized with respect to properties that are undesired in conventional circuits for high-voltage transistors, but which offer special advantages in an ESD protection circuit. Due to the relatively high saturation current that can be achieved, an overvoltage can be dissipated particularly quickly. The transistor structure offers the advantage that, despite the modification with respect to conventional high-voltage transistors, it can be produced as part of a standard manufacturing process without an excessively high expense to implement novel process steps.

The invention claimed is:
1. An ESD protection circuit comprising:
a trigger component; and
a protection transistor with a gate electrode,
wherein the trigger component is connected to the gate electrode and switches on the protection transistor when an overvoltage occurs, and
wherein the protection transistor comprises:
a substrate made of semiconductor material with an upper side;
doped wells on the upper side, that comprise a first well of a first conductivity type provided for a drift section and a second well, of a second conductivity type opposite to the first conductivity type, provided for a channel region;
a first contact area for a drain terminal in the first well;
a second contact area for a source terminal in the second well;
a gate dielectric on a region of the second well between the first contact area and the second contact area; and
a gate electrode on the gate dielectric, wherein the substrate is not doped or is doped for the first conductivity type,
wherein the protection transistor is a high-voltage transistor,
wherein underneath the first contact area, a part of the second well is present between the first well and the semiconductor material of the substrate that is not doped or doped for the first conductivity type, wherein the second well is formed with a depth, measured from the upper side of the substrate into the substrate, that is smaller under the first contact area than under the second contact area, and wherein underneath the first contact area, the depth of the second well is less than twice the depth of the first well, to permit a dissipation of electric current from the first well to the substrate.

2. The ESD protection circuit according to claim 1, wherein the first conductivity type is n-conduction and the second conductivity type is p-conduction.

3. An ESD circuit comprising:

a high-voltage transistor configured to short circuit an overvoltage to a reference potential, the high-voltage transistor comprising:

a substrate made of semiconductor material with an upper side;

a first contact area for a drain terminal in a first doped well of a first conductivity type that is arranged in a second doped well of a second conductivity type, opposite to the first conductivity type; and a second contact area for a source terminal, wherein the depth of the second doped well, measured from the upper side of the substrate into the substrate, is less underneath the first contact area than underneath the second contact area, and wherein underneath the first contact area, the depth of the second doped well is less than twice the depth of the first doped well, to permit a dissipation of electric current from the first doped well to the substrate.

\* \* \* \* \*